(12) United States Patent
Foutz et al.

(10) Patent No.: US 7,979,764 B2
(45) Date of Patent: Jul. 12, 2011

(54) DISTRIBUTED TEST COMPRESSION FOR INTEGRATED CIRCUITS

(75) Inventors: Brian Foutz, Silver Spring, MD (US); Patrick Gallagher, Apalachin, NY (US); Vivek Chickermane, Ithaca, NY (US); Carl Barnhart, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 561 days.

(21) Appl. No.: 11/933,853

(22) Filed: Nov. 1, 2007

(65) Prior Publication Data

US 2009/0119559 A1    May 7, 2009

(51) Int. Cl.
*G01R 31/28* (2006.01)
(52) U.S. Cl. ...................................... 714/729
(58) Field of Classification Search ................... 714/729
See application file for complete search history.

(56) References Cited

U.S. PATENT DOCUMENTS

| | | | |
|---|---|---|---|
| 6,611,933 B1 | 8/2003 | Koenemann et al. | |
| 7,032,148 B2 * | 4/2006 | Wang et al. | 714/729 |
| 7,197,721 B2 * | 3/2007 | Patil et al. | 716/1 |
| 7,512,851 B2 * | 3/2009 | Wang et al. | 714/726 |

OTHER PUBLICATIONS

IEEE Computer Society, "IEEE Standard Testability Method for Embedded Core-based Integrated Circuits," IEEE Standards Board, 1500-2005, IEEE Publication, USA, 2005.
Barnhart, C., et al. "OPMISR: The Foundation for Compressed ATPG Vectors," Proc. International Test Conference, pp. 748-757, 2001.
Barnhart, C., et al. "Extending OPMISR Beyond 10x Scan Test Efficiency," Design & Test of Computers, IEEE, pp. 65-73, Sep.-Oct. 2002.
Koenemann, B., et al., "A SmartBIST Variant with Guaranteed Encoding," Proc. Asian Test Symposium, pp. 325-330, 2001.
IEEE Computer Society, "IEEE Standard Test Interface Language (STIL) for Digital Test Vector Data-Core Test Language (CTL)," IEEE Standards Board, 1450.6-2005, IEEE Publication, USA, 2005.
Orailoglu, B., et al., "Test Volume and Application Time Reduction Through Scan Chain Concealment," Proc. Design Automation Conference., pp. 151-161, 2001.
Lee, K., et al., "Using a Single Input to Support Multiple Scan Chains," Proc. of the International Conference on Computer-Aided Design, pp. 74-78, Nov. 1998.
Hamzaoglu, I., et al., "Reducing Test Application Time for Full-Scan Embedded Cores," Digest of Papers, 29th International Symposium on Fault-Tolerant Computing, pp. 260-267, Jun. 1999.
Hsu, F., et al., "A Case Study on the Implementation of the Illinois Scan Architecture," Proc. International Test Conference, pp. 538-547, 2001.
Rajski, J. et al., "Embedded Deterministic Test for Low-Cost Manufacturing Test," Proc. International Test Conference, pp. 301-310, 2002.

(Continued)

*Primary Examiner* — James C Kerveros
(74) *Attorney, Agent, or Firm* — Sawyer Law Group, P.C.

(57) ABSTRACT

A method for testing integrated circuits is provided. The method provides for incorporating compression and decompression logic into each sub-component of an integrated circuit, developing test modes that target different sub-components of the integrated circuit, selecting one of the test modes, applying a test pattern to one or more sub-components of the integrated circuit targeted by the one test mode, comparing a response from application of the test pattern to a known good response, and diagnosing the response to determine which part of the one or more sub-components targeted by the one test mode failed when the response does not match the known good response.

21 Claims, 9 Drawing Sheets

OTHER PUBLICATIONS

Mitra, K. S., et al., 'X-Compact: An Efficient Response Compaction Technique for Test Cost Reduction, pp. 311-320, 2002.

Wohl, J.A., et al., "X-Tolerant Compression and Application of Scan-ATPG patterns in a BIST architecture," Proc. International Test Conference, pp. 727-736, 2003.

Keller, B., et al., "An Economic Analysis and ROI Model for Nanometer Test," Proc. International Test Conference, 2004.

Gallagher, P., et al. "A Building Block BIST Methodology for SoC Designs: A Case Study," Proc. International Test Conference, pp. 111-120, 2001.

Keller, B., et al., "Built-In Self-Test Support in the IBM Engineering Design System," IBM Journal of Research and Development, pp. 405-415, Mar. 1990.

Paul H. Bardell and William H. McAnney, "Self-Testing of Multi-Chip Logic Modules," Reprinted from Proceedings International Test Conference, pp. 200-204, 1982.

* cited by examiner

_(1)_

DISTRIBUTED TEST COMPRESSION FOR INTEGRATED CIRCUITS

FIELD OF THE INVENTION

The present invention relates generally to testing of integrated circuits. More specifically, the present invention relates to a method of inserting test decompression and compression logic in a distributed methodology that allows sub-components of an integrated circuit to be tested independently of or simultaneously with other components of the integrated circuit.

BACKGROUND OF THE INVENTION

During the manufacturing process, integrated circuits (ICs) must be quickly tested to determine whether each integrated circuit is functioning correctly without any physical defects. One common approach is scan testing, which allows an initial state to be loaded into an integrated circuit and tests to be performed from that initial state.

A specific state can be loaded into an integrated circuit by designing into the integrated circuit a special mode called a "scan mode" where all the state elements in the integrated circuit are chained together into one or more shift registers called scan chains. The integrated circuit can then be placed on automatic test equipment (ATE), which initializes the integrated circuit to a state (e.g., scan pattern) through the scan chains, applies some tests on the integrated circuit from the state, and then uses the scan chains to unload response data from the integrated circuit after the tests have been applied.

To determine whether an integrated circuit is functioning correctly, unloaded response data from an integrated circuit is compared against a known good response. If the responses do not match, the integrated circuit is identified as faulty. This process is repeated for different scan patterns until the integrated circuit can be validated as functioning defect free.

There are several aspects of scan testing that make it practical. First, it is possible to apply a large number of tests to an integrated circuit in a short amount of time. Second, hardware overhead required to incorporate a scan mode into the integrated circuit is typically not significant compared to functional logic of the integrated circuit. Finally, it is possible to diagnose response data to determine which part of the integrated circuit is failing.

Today's designs with geometries smaller than 130 nanometers (nm) may include millions of state elements. Such large designs are now stressing the limits of the scan testing approach because of excessive test data volume, increasing test application time, and escalating test costs. To reduce test storage requirements and decrease test application time, scan-based test compression techniques have become common. To decrease hardware overhead, these test compression techniques tend to reduce the accuracy of the results. This makes the diagnosis of failures and yield problems more difficult.

Scan compression techniques can also impact the design methodology for large integrated circuits. Designers of large integrated circuits often use a hierarchical approach. The overall design of an integrated circuit is broken down into smaller parts. Different design teams are responsible for completing their assigned parts of the integrated circuit. The design activities of the different parts occur in parallel with very little synchronization. One part of the design may be completed long before another part, or in some cases, parts may be acquired from a third party design vendor.

A major limitation of existing test compression solutions for integrated circuits is that existing test compression solutions require that the compression logic be added after the design's parts have been integrated. In addition, the entire integrated circuit is required to be tested all together and all at the same time. As a result, it is very difficult to apply existing test compression solutions to an integrated circuit that is hierarchical designed because of the constraints placed on the design of the integrated circuit by the test logic. These constraints can add additional steps to the design methodology very late in the design cycle, which increases schedule risk.

SUMMARY OF THE INVENTION

The present invention provides an approach to partitioning scan compression across large integrated circuits. By distributing compression logic across various sub-components of an integrated circuit design, the present invention allows the sub-components to be completed with compression logic inserted before the rest of the design is integrated. This approach allows individual sub-components of an integrated circuit to be tested independently and makes it easier to diagnose failing chips.

A method for testing integrated circuits is provided. The method provides for incorporating compression and decompression logic into each component of an integrated circuit, developing test modes for the integrated circuit, each test mode targeting a set of one or more components of the integrated circuit, selecting one of the test modes, applying a test pattern to the set of one or more components of the integrated circuit targeted by the test mode selected, comparing a response from application of the test pattern to a known good response, and diagnosing the response to determine which part of the integrated circuit failed when the response does not match the known good response.

An integrated circuit is also provided. The integrated circuit comprises a first part, the first part comprising a first compression logic and a first decompression logic, and a second part distinct from the first part, the second part comprising a second compression logic distinct from the first compression logic and a second decompression logic distinct from the first compression logic.

A method and computer-readable medium encoded with a computer program for testing integrated circuits are further provided. The method and computer program provide for incorporating a first compression logic and a first decompression logic into a first part of an integrated circuit and providing a second compression logic and a second decompression logic in a second part of the integrated circuit, the second compression logic being distinct from the first compression logic, the second decompression logic being distinct from the first decompression logic, and the second part of the integrated circuit being distinct from the first part of the integrated circuit.

DETAILED DESCRIPTION

Figure 1:
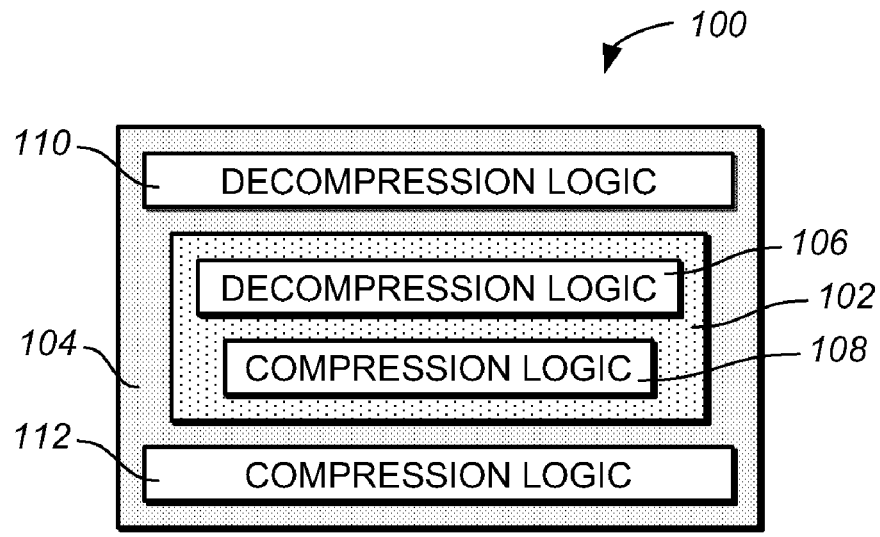
FIG. 1 depicts an integrated circuit according to an implementation of the invention.

The present invention generally relates to test compression for integrated circuits. The following description is presented to enable one of ordinary skill in the art to make and use the invention and is provided in the context of a patent application and its requirements. The present invention is not intended to be limited to the implementations shown, but is to be accorded the widest scope consistent with the principles and features described herein.

Integrated circuit (IC) designers are increasingly adopting a hierarchical approach to designing integrated circuits due to the trend towards larger and more complex integrated circuits and the desire to reuse preexisting intellectual property (e.g., memories, microcontrollers, microprocessors, digital signal processors (DSPs), etc.). With the hierarchical approach, different teams of designers are responsible for designing different parts (e.g., blocks, cores, modules, components, sub-blocks, sub-cores, sub-modules, sub-components, etc.) of an integrated circuit. This can lead to a reduction in the total amount of time needed to complete the overall design of the integrated circuit as different parts of the integrated circuit can be designed concurrently. Sometimes, the different design teams are located in multiple geographical locations and/or at various companies.

Although the hierarchical approach has quickly spread to certain integrated circuit design techniques, such as System-on-Chip (SoC), it has been slow to spread to other integrated circuit design techniques, such as Design-for-Test (DFT). With DFT, certain testability features are added to an integrated circuit design to make it easier to develop manufacturing tests (e.g., tests to ensure that the integrated circuit contains no defects that could prevent it from functioning correctly) and apply the manufacturing tests to the designed integrated circuit. In addition, DFT techniques make it easier to develop test algorithms and generate test data through, for instance, automatic test pattern generation (ATPG).

Recently, test compression solutions have been added to DFT techniques to reduce test application time and test data volume. Logic affiliated with test data decompression and response data compression, however, is typically added in such a way that an integrated circuit can only be tested as a whole. Consequently, the hierarchical approach would not work because parts of an integrated circuit cannot be tested independently from one another, which prevents the design for each part of the integrated circuit to be completed separately.

Attempts have been made to perform hierarchical test compression using some sort of test bus architecture. With the test bus architecture, a set of test access ports is distributed to each part of an integrated circuit that needs to be tested individually. On the output side, a set of multiplexers (MUXes) is used to select which part is active and available for test. In its simplest form, each part of the integrated circuit shares the same test bus, and as a result, only one can be tested at any time.

To get around the limitation of only being able to test one part at a time, it is possible to daisy chain multiple parts of the integrated circuit or to use multiple test busses. Daisy chaining the test bus, however, means that parts of the integrated circuit that are daisy chained together must be tested together, unless additional bypass logic is added, which increases hardware overhead. Having multiple test busses also increases hardware overhead as additional logic will need to be added to the integrated circuit. Further, the combination of parts that can be tested together is limited by the hardware added to the integrated circuit.

The IEEE 1500 Standard entitled, "Standard Testability Method for Embedded Core-based Integrated Circuits" addresses some of the previously mentioned issues associated with performing compression on an integrated circuit that has been designed using a hierarchical methodology. However, the IEEE 1500 Standard was developed before scan compression methodology was mature so it does not address many of the complexities associated with inserting and testing scan compression logic. Many implementations of the IEEE 1500 Standard rely on the daisy chains, test buses, and bypass structures described in the previous paragraphs. This invention describes a compression architecture that is 100% compatible with the framework of the IEEE 1500 Standard, but eliminates much of the overhead associated with prior implementations of core-based Design-for-Test solutions.

Depicted in FIG. 1 is an integrated circuit 100 according to an implementation of the invention. Integrated circuit 100 is being designed hierarchically in two parts—a part 102 and a part 104. Part 102 may be, for instance, a block, a sub-block, a core, a sub-core, a module, a sub-module, a component, a sub-component, or the like of integrated circuit 100. To give some examples, part 102 may be a microcontroller, a section of a microcontroller, a microprocessor, a section of a microprocessor, a DSP, a section of a DSP, an arithmetic logic unit (ALU), a section of an ALU, a memory unit, a section of a memory unit, or something similar.

Part 102 includes a decompression logic 106 and a compression logic 108. In one implementation, decompression logic 106 and compression logic 108 are utilized to perform compression testing on part 102 of integrated circuit 100 independently of part 104. Although not depicted in FIG. 1, part 102 may include other elements, such as additional logic (e.g., functional logic, masking logic, etc.), multiple input signature registers (MISRs), I/Os, and so forth.

In the implementation of FIG. 1, part 104 is everything else in integrated circuit 100 that is outside of part 102, which may include additional block(s), sub-block(s), core(s), sub-core(s), module(s), sub-module(s), component(s), sub-component(s), or the like. Part 104 includes a decompression logic 110 that is distinct from decompression logic 106 and a compression logic 112 that is distinct from compression logic 108. In one mode, decompression logic 110 and compression logic 112 are used to perform compression testing on part 104 of integrated circuit 100 independently of part 102.

Decompression logic 110 and compression logic 112 may also be used to perform compression testing on integrated circuit 100 as a whole. Further, since part 102 and part 104 each includes its own set of decompression-compression logic, compression testing of part 102 can be performed in parallel with compression testing of part 104.

Integrated circuit 100 may be hierarchically divided into more than two parts. Some parts may be next to each other, but independent (e.g., hierarchical siblings). Other parts may be nested inside one another (e.g., hierarchical parent-child relationship). When an integrated circuit is divided into more than two parts, not all of the parts may have its own compression logic and decompression logic. Additionally, even when a part includes its own compression logic and decompression logic, the compression logic and decompression logic may only be used to test a portion of the part.

Figure 2:
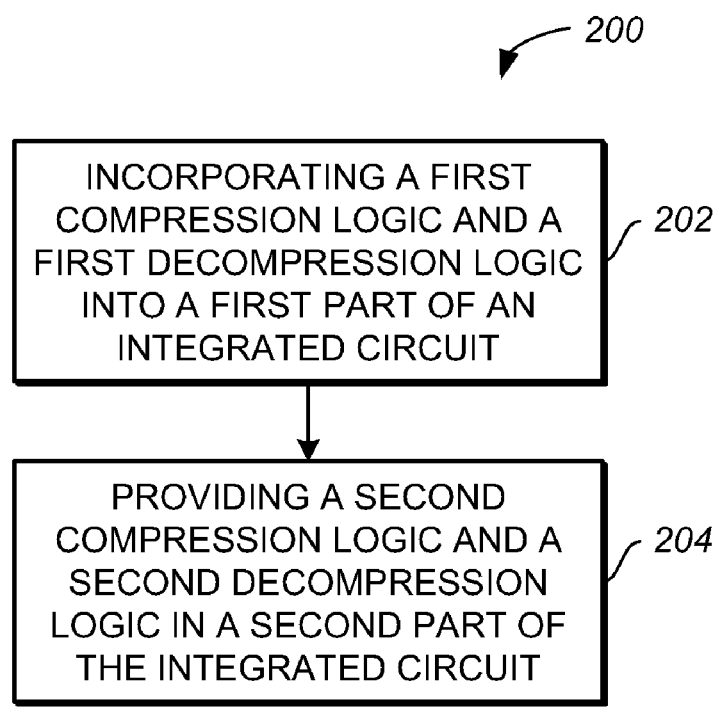
FIG. 2 is a process flow of a method for testing integrated circuits according to an implementation of the invention.

FIG. 2 illustrates a process 200 for testing integrated circuits according to an implementation of the invention. At 202, a first compression logic and a first decompression logic are incorporated into a first part of an integrated circuit. The first part of the integrated circuit may be, for instance, a block, a sub-block, a core, a sub-core, a module, a sub-module, a component, a sub-component, or the like of the integrated circuit. In one implementation, the first compression logic and the first decompression logic are usable in performing compression testing solely on the first part of the integrated circuit. In another implementation, the first compression logic and the first decompression logic are usable in performing compression testing solely on a portion of the first part of the integrated circuit.

At 204, a second compression logic and a second decompression logic are provided in a second part of the integrated circuit. The second part of the integrated circuit is distinct from the first part of the integrated circuit. In one implementation, the second part of the integrated circuit is another block, another sub-block, another core, another sub-core, another module, another sub-module, another component, another sub-component, or something similar. In another implementation, the second part of the integrated circuit is everything else in the integrated circuit other than the first part.

The second compression logic is distinct from the first compression logic. Additionally, the second decompression logic is distinct from the first decompression logic. In one implementation, the second compression logic and the second decompression logic are usable in performing compression testing solely on the second part of the integrated circuit. In another implementation, the second compression logic and the second decompression logic are usable in performing compression testing solely on a portion of the second part of the integrated circuit. In a further implementation, the second compression logic and the second decompression logic are usable in performing compression testing on the integrated circuit as a whole.

By distributing compression and decompression logic across hierarchical design boundaries of an integrated circuit, compression testing of integrated circuits is no longer restricted to only being able to compression test an integrated circuit as a whole. Each part of an integrated circuit that is being designed separately can now be tested independently of and/or in parallel with other parts of the integrated circuit.

In addition, allowing parts of an integrated circuit to be tested sequentially or concurrently enables test engineers to schedule tests without exceeding the power limit of a device under test. Further, distributing compression and decompression logic across hierarchical design boundaries has a much lower hardware overhead than having multiple test busses or daisy chaining different parts of the integrated circuit.

Figure 3:
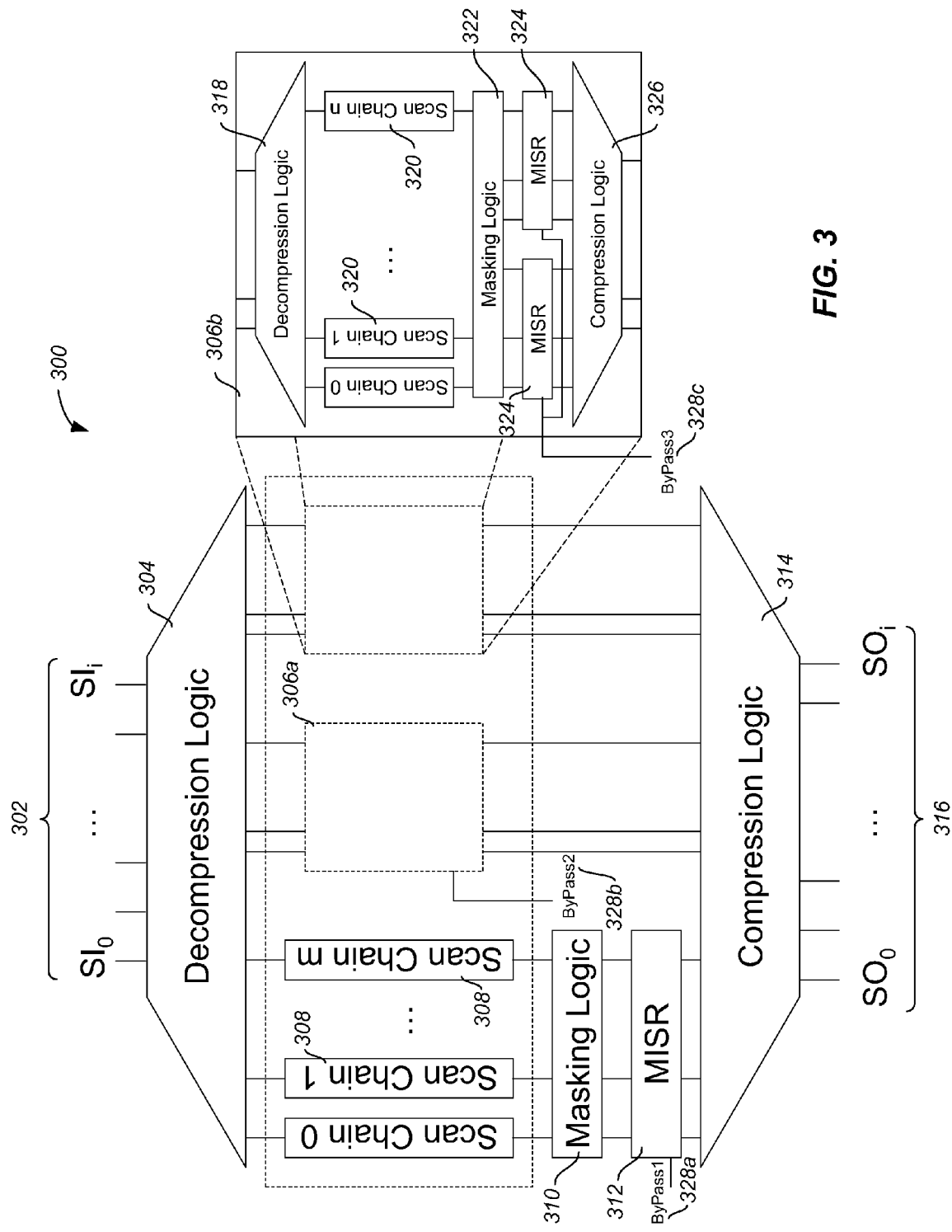
FIG. 3 illustrates a block diagram of a sample integrated circuit according to an implementation of the invention.

Shown in FIG. 3 is a block diagram of a sample integrated circuit 300 according to an implementation of the invention. Integrated circuit 300 includes a plurality of scan inputs ($SI_0$ to $SI_i$) 302, a decompression logic 304, components 306a and 306b, scan chains 308, a masking logic 310, a multiple input signature register (MISR) 312, a compression logic 314, and a plurality of scan outputs ($SO_0$ to $SO_j$) 316. Compressed test data (e.g., stimuli, test pattern, etc.) can be fed into decompression logic 304 via scan inputs 302 from a tester (not shown). Decompression logic 304 is operable to decompress (e.g., expand) the test data received and feed the decompressed test data into scan chains 308 and/or components 306a-306b.

Decompression logic 304 may include some type of combinational logic fan-out where each scan input 302 feeds a set of scan chains 308. The ratio of the number of scan chains 308 to the number of scan inputs 302 is known as the fan-out. A scan chain is a plurality of latches (e.g., flip-flops) that are wired together. Latches in an integrated circuit are wired into a plurality of scan chains to make it easier to put the integrated circuit into different states for testing purposes. Decompression logic 304 may also include a shift register (not shown) to recycle earlier scan input data or other logic to control how data from scan inputs 302 is distributed to scan chains 308.

Response data, which resulted from the test data inputted into scan chains 308, outputs from scan chains 308 into masking logic 310. Masking logic 310 can then be used to block unknown values in the response data. In another implementation, masking logic 310 is used to map unknown values in the response data to known values. For instance, if the response data is 10x1, masking logic 310 may map the 'x' to a 0 or a 1.

Once all unknown values in the response data are removed or mapped to known values, MISR 312 can be used to perform an initial compression of the response data from scan chains 308. The response data from scan chains 308 can then be further compressed using compression logic 314 before being outputted via scan outputs 316. Masking logic 310 and MISR 312 are optional and may not be included in other implementations. In addition, rather than using MISR compression, XOR compression or some combination of MISR/XOR compression can be used instead.

As shown in FIG. 3, component 306b includes its own decompression logic 318, scan chains 320, masking logic 322, set of MISRs 324, and compression logic 326. Although not shown, component 306a also includes its own decompression logic, scan chains, masking logic, MISR(s), and compression logic. Decompression logic 318, scan chains 320, masking logic 322, MISRs 324, and compression logic 326 are sometimes referred to as being at the component-level, block-level, or core-level of integrated circuit 300 to differentiate from decompression logic 304, scan chains 308, masking logic 310, MISR 312, and compression logic 314, which are sometimes referred to as being at the top-level or chip-level of integrated circuit 300. Even though only two levels are shown in FIG. 3, an integrated circuit may include additional levels (e.g., chip-level, block-level, sub-block level, etc.)

Since components 306a and 306b each includes its own masking logic and MISRs, additional masking logic and MISR are not needed at the top-level for components 306a and 306b. The arrangement of decompression logic, compression logic, masking logic, and MISRs in integrated circuit 300 not only allows components 306a and 306b to be tested individually, but also allows the entire integrated circuit 300 to be tested all at once.

In FIG. 3, each part of integrated circuit 300 is equipped with a bypass signal 328, i.e., the top-level of integrated circuit 300 is equipped with bypass signal 328a, component 306a is equipped with bypass signal 328b, and component 306b is equipped with bypass signal 328c. When the bypass signal 328 of a part of integrated circuit 300 is asserted, each MISR of that part of integrated circuit 300 is held to an all zero value. Hence, the bypass signals 328 can be used to selectively test different parts of integrated circuit 300.

For example, to test component 306b, the bypass signal 328c for component 306b would be left off, while the bypass signals for the rest of integrated circuit 300 (e.g., bypass signals 328a and 328b) remain on. Hence, while tests are performed on component 306b, the MISRs in the rest of integrated circuit 300 would be held at zero. If necessary for power or other concerns, other parts of integrated circuit 300 could be disabled by clock gating or other means. When testing of component 306b concludes, the MISRs 324 of component 306b will be the only one to produce a signature that influences data exiting scan outputs 316 as all the other MISRs in integrated circuit 300 will be held at zero.

Similarly, any part of integrated circuit 300 can be included in a test by de-asserting its bypass signal 328 during testing. Thus, several parts of integrated circuit 300 can be tested in parallel. In addition, the logic outside of components 306a and 306b can be tested independently of components 306a and 306b. When all bypass signals 328 are de-asserted, all MISRs in integrated circuit 300 will be active. As a result, the entire integrated circuit 300 will be tested together.

Figure 4:
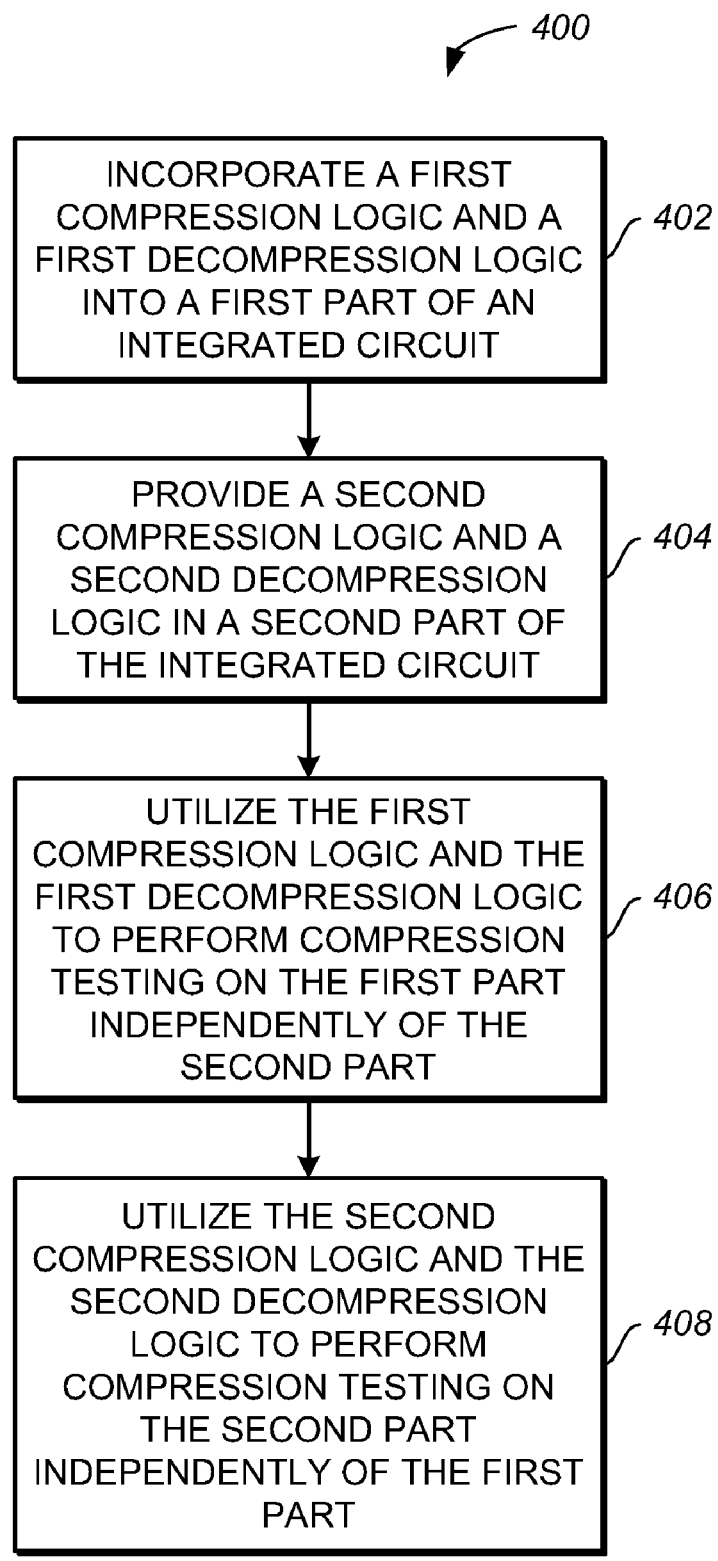
FIG. 4 shows a process flow of a method for testing integrated circuits according to an implementation of the invention.

FIG. 4 depicts a process 400 for testing integrated circuits according to an implementation of the invention. At 402, a first compression logic and a first decompression logic are incorporated into a first part of an integrated circuit. In one implementation, the first part of the integrated circuit is a component (e.g., an ALU) or a sub-component (e.g., a section of an ALU) of the integrated circuit.

At 404, a second compression logic and a second decompression logic are provided in a second part of the integrated circuit. The second part of the integrated circuit may be another component or another sub-component of the integrated circuit, or the second part could be everything else in the integrated circuit except the first part. In one implementation, the first part and the second part are designed by different design teams.

The first compression logic and the first decompression logic are utilized to perform compression testing on the first part of the integrated circuit independently of the second part of the integrated circuit at 406. In one implementation, the first compression logic and the first decompression logic are utilized to perform compression testing on a portion of the first part of the integrated circuit independently of the second part of the integrated circuit.

At 408, the second compression logic and the second decompression logic are utilized to perform compression testing on the second part of the integrated circuit independently of the first part of the integrated circuit. In one implementation, the second compression logic and the second decompression logic are utilized to perform compression testing on a portion of the second part of the integrated circuit independently of the first part of the integrated circuit. In another implementation, the second compression logic and the second decompression logic are utilized to perform compression testing on the integrated circuit as a whole.

Figure 5:
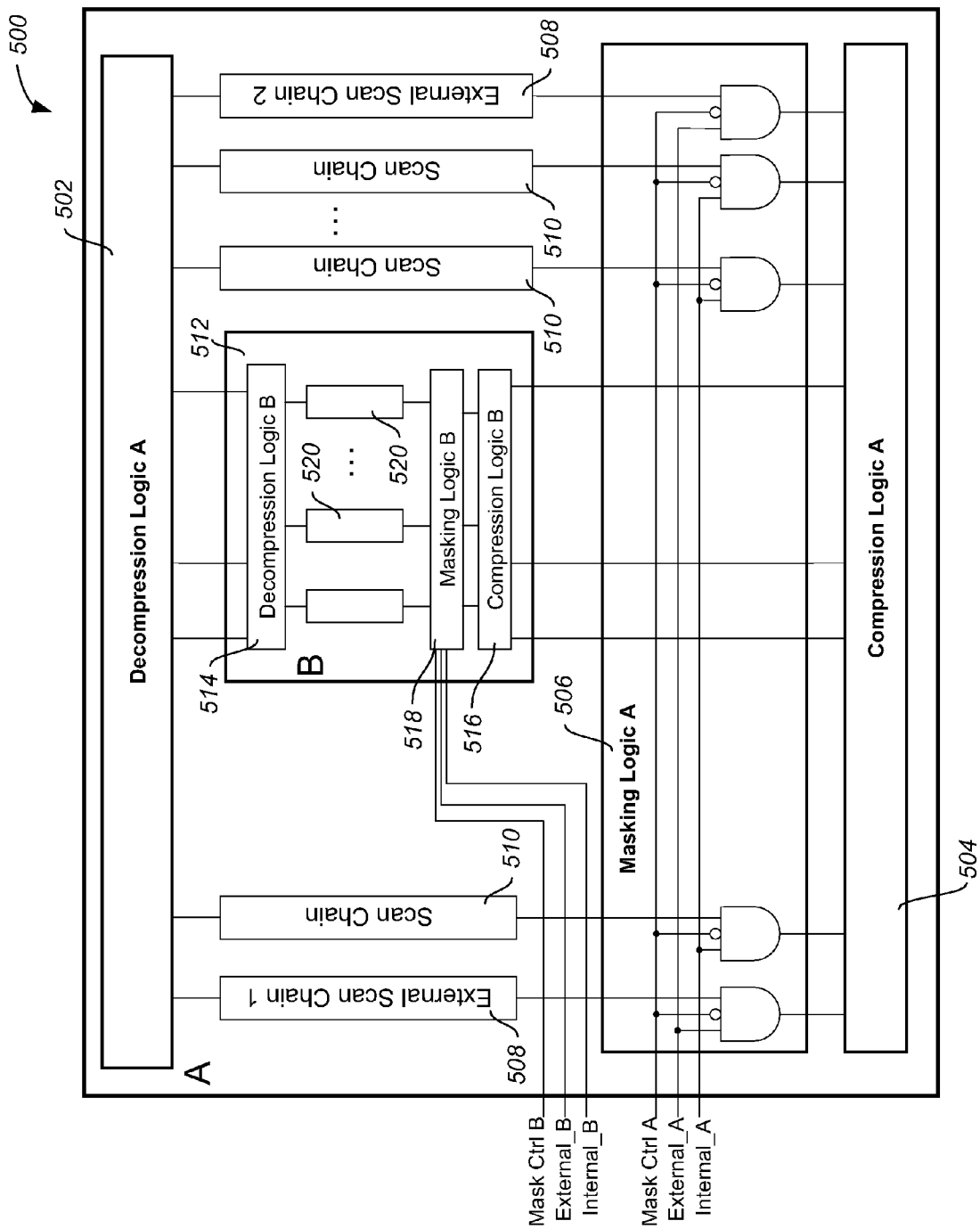
FIG. 5 depicts a block diagram of a sample integrated circuit according to an implementation of the invention.

Illustrated in FIG. 5 is a block diagram of a sample sub-component A 500 of a larger integrated circuit (not shown) according to an implementation of the invention. Sub-component A 500 includes a decompression logic A 502, a compression logic A 504, a masking logic A 506, external scan chains 508, and internal scan chains 510. Also included in sub-component 500 is another sub-component B 512, which includes its own decompression logic B 514, compression logic B 516, masking logic B 518, and scan chains 520.

In the implementation, logic to control whether a particular sub-component will be included for testing in a given test mode is included as part of the masking logic of the particular sub-component. Masking logic A 506 is controlled by a Mask Ctrl A signal, which may include multiple control bits even though it is illustrated as a single signal. In a different implementation, similar logic to control which sub-component will be included in a test could be employed separate from masking logic 506.

Two additional signals, External_A and Internal_A, are used in addition to the Mask Ctrl A signal. These signals are used to additionally mask the two types of scan chains, external scan chains 508 and internal scan chains 510. Internal scan chains 510 include state elements that only interact with internal logic of sub-component A 500 and not with logic that is external to sub-component A 500. External scan chains 508 include state elements that can observe the inputs and outputs of sub-component A 500. These state elements could be specially selected among existing state elements of sub-component A 500 or could be part of wrapper logic, such as described in the IEEE 1500 Standard.

To increase the testability of a block instantiating sub-component A 500 while sub-component A 500 itself is not being tested, signal External_A can be asserted. This allows observation of signals feeding the inputs of sub-component A 500 and control of signals at the outputs of sub-component A 500. Signal Internal_A would not be asserted to block internal scan chains 510, which effectively removes the internal part of sub-component A 500 from testing.

Similar internal and external signals can be provided for each sub-component of an integrated circuit, such as illustrated for sub-component B 512 in FIG. 5. When neither sub-component A 500 nor sub-component B 512 is being tested, the External_A, Internal_A, External_B, and Internal_B signals are left off. This masks all channels entering the compression logic for these sub-components. If the compression logic includes either MISR or XOR compression, for example, the output of the compression logic would remain at zero for the duration of the test.

Assuming there are no other sub-components in the integrated circuit in which sub-components 500 and 512 are a part of, it may be desirable to independently test the top-level component, i.e., the logic external to sub-component A 500, sub-component A 500 itself, and separately, sub-component B 512. A table is presented below showing three test modes and values for the internal and external signals to test each component independently.

| Sub-Component Under Test | Internal_A | External_A | Internal_B | External_B |
| --- | --- | --- | --- | --- |
| External to A | 0 | 1 | 0 | 0 |
| A only | 1 | 1 | 0 | 1 |
| B only | 0 | 0 | 1 | 1 |

As mentioned above, to test the parts of the integrated circuit external to sub-component A 500, only signal External_A needs to be asserted to allow observation and control of the inputs and outputs of sub-component A 500. To test sub-component A 500 only, both the Internal_A signal and the External_A signal have to be asserted as internal scan chains 510 and external scan chains 508 are included in the test. In addition, scan chains 520 of sub-component B 512 that are designated as external are included to allow inputs and outputs of sub-component B 512 to be observed and controlled.

To only test sub-component B 512, only scan chains 520 need to be included. Hence only the Internal_B and External_B signals need to be asserted.

The implementation of FIG. 5 offers flexibility as well. For instance, if two or more sub-components need to be tested simultaneously, one can logically OR the values from multiple rows in the table above. As an example, to test logic external to sub-component A 500 and sub-component A 500 without including sub-component B 512, all signals except Internal_B would be asserted. To test the entire integrated circuit in parallel, all signals would be asserted.

Figure 6:
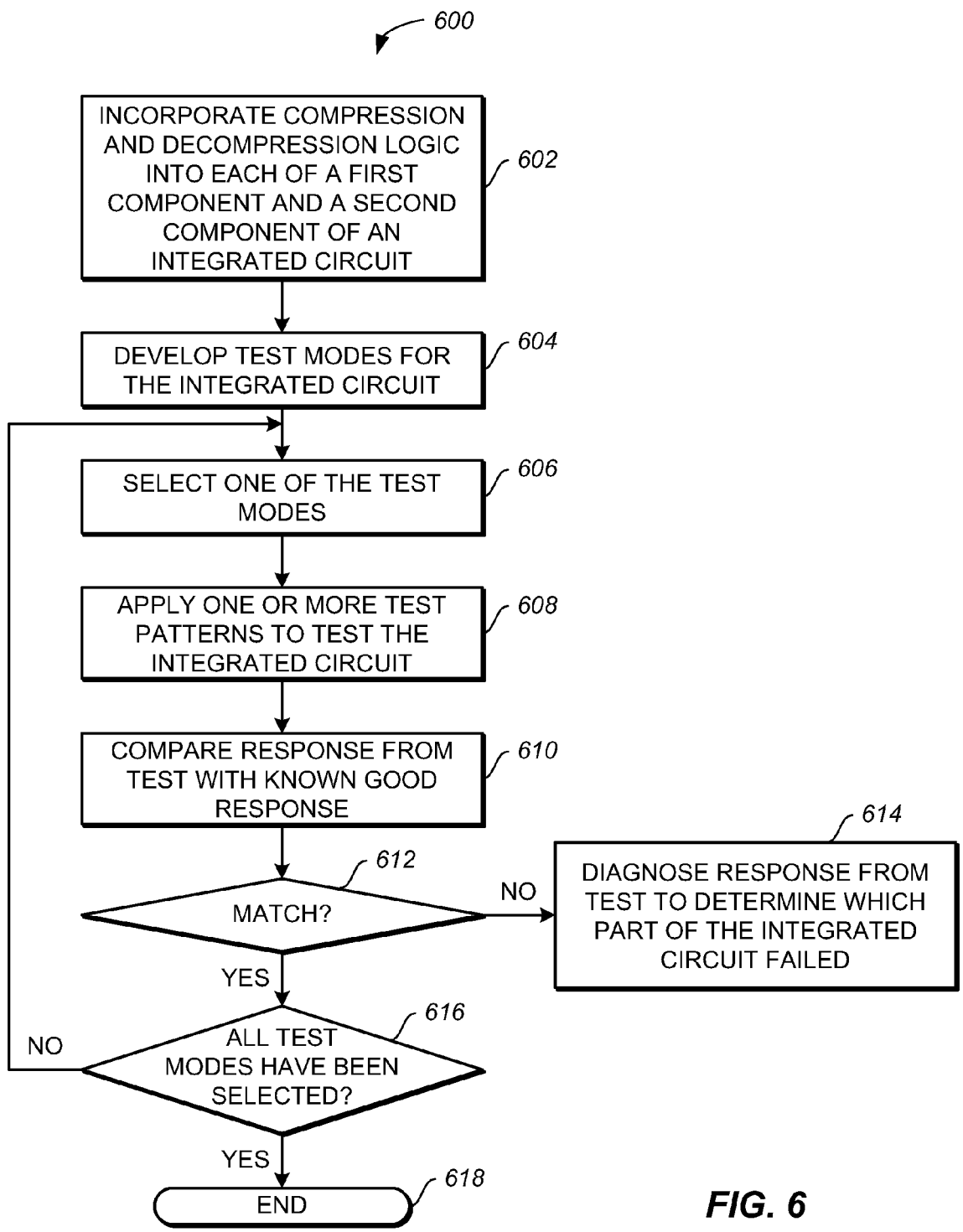
FIG. 6 illustrates a process flow of a method for testing integrated circuits according to an implementation of the invention.

FIG. 6 shows a process 600 for testing integrated circuits according to an implementation of the invention. At 602, a first set of decompression and compression logic are incorporated into a first component of an integrated circuit and a second set of decompression and compression logic are incorporated into a second component of the integrated circuit. In one implementation, the second component is a sub-component of the first component.

Each of the first component and the second component includes a plurality of internal scan chains and a plurality of external scan chains. A first signal controls the plurality of internal scan chains of the first component. A second signal controls the plurality of external scan chains of the first component. A third signal controls the plurality of internal scan chains of the second component. A fourth signal controls the plurality of external scan chains of the second component.

A plurality of test modes is developed at 604 for the integrated circuit. Each test mode is associated with a different on/off combination of the first, second, third, and fourth signals. For instance, a first test mode is associated with a combination where all four signals are on (e.g., asserted), a second test mode is associated with a combination where the first and second signals are off (e.g., not asserted) and the third and fourth signals are on, a third test mode is associated with a combination where the first, second, and fourth signals are on and the third signal is off, and so forth. As a result, each test mode can be used to isolate a different portion of the integrated circuit for testing. For instance, the first test mode can be used to test the first and second components, the second test mode can be used to test the second component only, the third test mode can be used to test the first component only, and so forth.

At 606, one of the plurality of test modes is selected. Each of the first, second, third, and fourth signals being in an on or off state in accordance with the on/off combination associated with the one test mode selected. At 608, one or more test patterns are applied to test the integrated circuit. At 610, a response from the test is compared with a known good response. A determination is made at 612 as to whether the response from the test matches the known good response.

If the response from the test does not match the known good response, the response from the test is diagnosed at 614 to determine which part of the integrated circuit failed. On the other hand, if the response from the test matches the known good response, then a determination is made at 616 as to whether all test modes have been selected. When all test modes have been selected, process 600 ends at 618. Otherwise, process 600 returns to 606 to select another test mode that has yet to be selected.

Figure 7A:
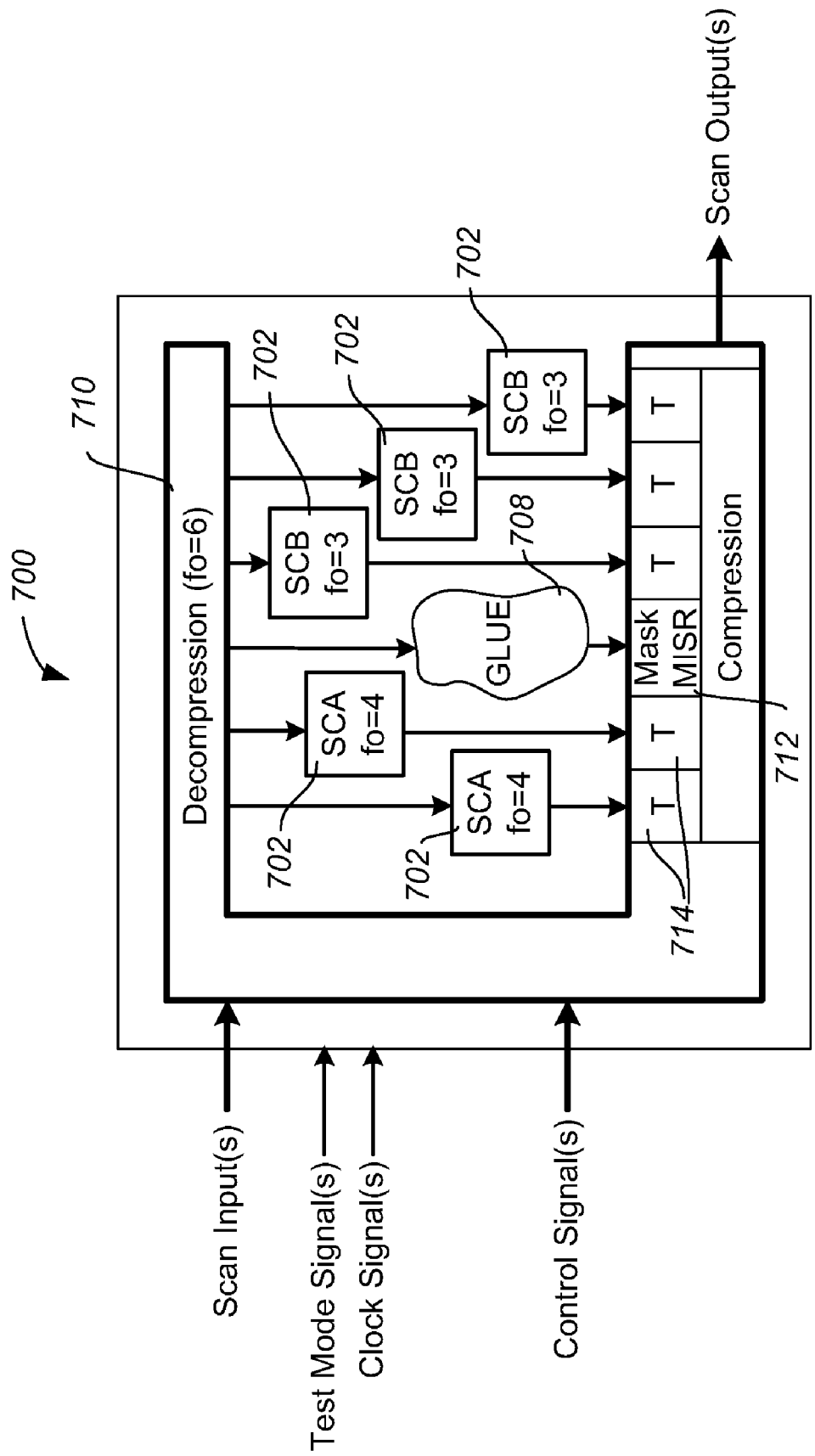
FIGS. 7A-7B are sample architectures of an integrated circuit and a sub-component of the integrated circuit according to an implementation of the invention.
Figure 7B:
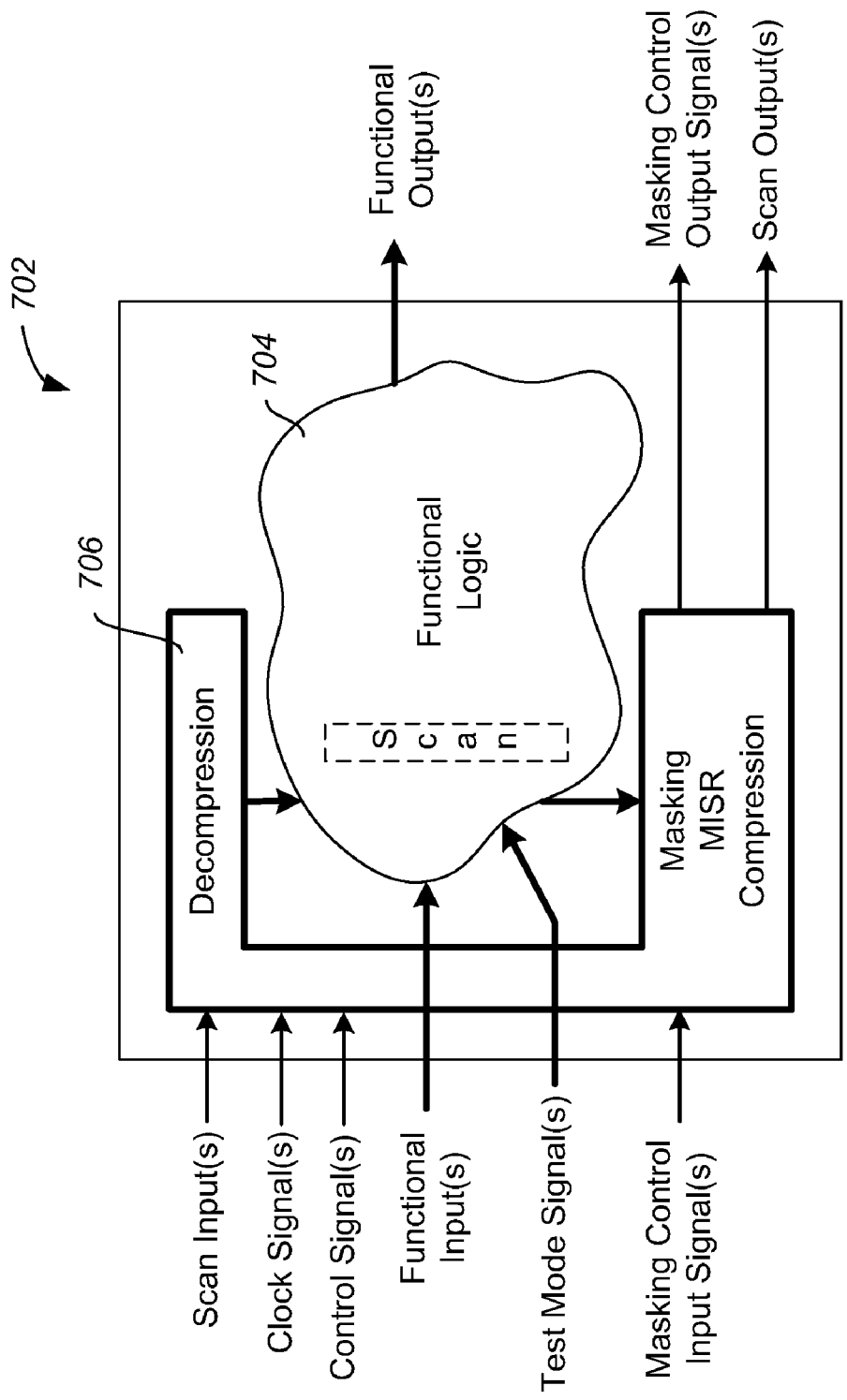

Depicted in FIGS. 7A-7B are sample architectures of an integrated circuit 700 and a sub-component 702 of integrated circuit 700 according to an implementation of the invention. As illustrated in FIG. 7A, integrated circuit 700 includes five sub-components 702. Two of the sub-components 702 are of type SCA. Three of the sub-components are of type SCB.

As illustrated in FIG. 7B, sub-component 702 of integrated circuit 700 includes functional logic 704 and a block of decompression/masking/MISR/compression logic 706. Various inputs, signals, and outputs are going into and coming out of functional logic 704 and block 706. In the implementation, sub-component 702 can be placed in one of three modes: INTEST (e.g., Internal and External signals for sub-component 702, which are not specifically illustrated in FIG. 7, are asserted), EXTEST (e.g., only External signal for sub-component 702 is asserted), or BYPASS (e.g., both Internal and External signals for sub-component 702 are de-asserted).

When sub-component 702 is in the INTEST mode, the Internal and External signals for that sub-component will be asserted and block 706 will produce a signature to validate functional logic 704 of sub-component 702. More than one sub-component 702 in integrated circuit 700 can be placed into INTEST mode and run in parallel. Signatures produced from each sub-component being tested in parallel can be XOR compacted together.

If sub-component 702 is in the BYPASS mode, scan chains (not shown) of functional logic 704 will be bypassed and the MISR in block 706 will be held at zero. In other words, sub-component 702 will not be included in any testing while in the BYPASS mode. When sub-component 702 is in the EXTEST mode, logic external to sub-component 702 is being tested while sub-component 702 is not being tested. Under the EXTEST mode, latches at the boundary of sub-component 702 are placed into special boundary scan chains, while other scan chains of sub-component 702 remain bypassed. The boundary scan chains may be used, for instance, to capture and observe top-level glue logic.

Referring back to FIG. 7A, integrated circuit 700 also includes glue logic 708, which provides an interface between sub-components 702. A block of decompression/compression logic 710 is provided at the top-level of integrated circuit 700. A sub-block of masking logic and MISR 712 is provided within block 710 for glue logic 708. Thru sub-blocks 714 are also provided within block 710 for each of the sub-components 702 in order to allow the masking logic and MISR(s) in each of the sub-components 702 to be used.

The top-level of integrated circuit 700 (e.g., everything external to sub-components 702) can also be placed in the INTEST mode or the BYPASS mode in the implementation. There is no need to have an EXTEST mode for the top-level of integrated circuit 700 because there is no higher level in integrated circuit 700.

To give an example with respect to integrated circuit 700, assume that the size of each MISR (at the top-level and at the sub-block level) is 32 bits. In other words, the downward arrows shown entering and existing each sub-component 702 and glue logic 708 each represents 32 bits of data. Since each sub-component 702 of SCA-type has a fan-out (fo) of 4 and each sub-component 702 of SCB-type has a fan-out of 3, there are 128 scan chains in each sub-component 702 of SCA-type and 96 scan chains in each sub-component 702 of SCB-type. In addition, since the block of decompression/compression logic 710 has a fan-out of 6, one for each of the sub-components 702 and one for the glue logic 708, there are a total of 576 (=2*128+3*96+32) scan chains in integrated circuit 700. The 32 scan chains are part of glue logic 708.

Although each sub-component 702 could have its own bypass control, the two sub-components 702 of SCA-type can be tested together and the three sub-components of SCB-type can be tested together to be more efficient. To achieve this, four top-level control signals may be used, one to place sub-components 702 of SCA-type in either INTEST or BYPASS mode, one to place sub-components 702 of SCB-type in either INTEST or BYPASS mode, and one to place top-level glue logic 708 in either INTEST or BYPASS mode. The fourth signal, to be asserted when testing the top-level glue logic only, places sub-components 702 in EXTEST mode.

Figure 8:
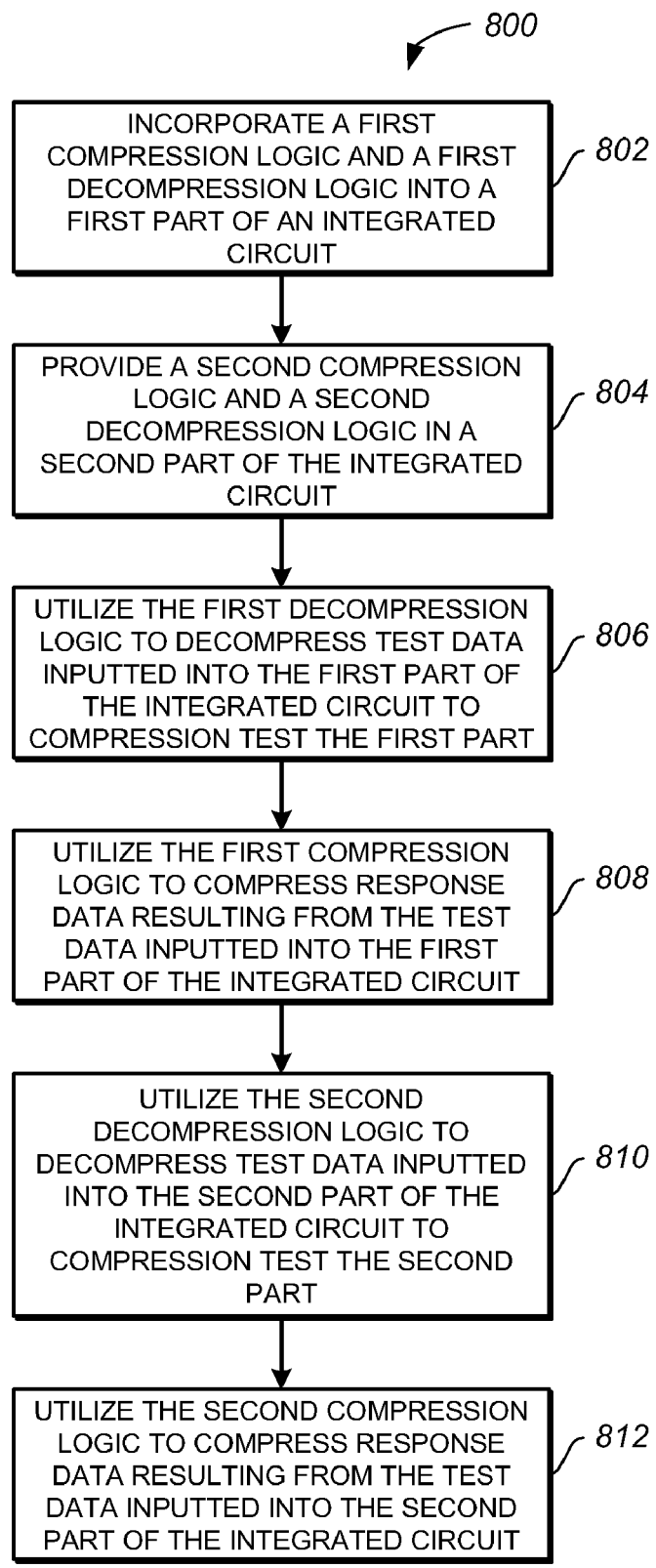
FIG. 8 shows a process flow of a method for testing integrated circuits according to an implementation of the invention.

FIG. 8 illustrates a process 800 for testing integrated circuits according to an implementation of the invention. At 802, a first compression logic and a first decompression logic are incorporated into a first part of an integrated circuit. At 804, a second compression logic and a second decompression logic are provided in a second part of the integrated circuit. In the implementation, the second compression logic is distinct from the first compression logic, the second decompression logic is distinct from the first decompression logic, and the second part of the integrated circuit is distinct from the first part of the integrated circuit.

The first part may be a component or a sub-component of the integrated circuit and the second part may be another component or another sub-component of the integrated circuit. At 806, the first decompression logic is utilized to decompress test data inputted into the first part of the integrated circuit to compression test the first part. At 808, the first compression logic is utilized to compress response data resulting from the test data inputted into the first part of the integrated circuit. MISR compression, XOR compression, or a combination of MISR and XOR compression may be used to compress the response data resulting from the test data inputted into the first part of the integrated circuit. In one implementation, the second part of the integrated circuit may be placed in a bypass mode before compression testing the first part.

At 810, the second decompression logic is utilized to decompress test data inputted into the second part of the integrated circuit to compression test the second part. At 812, the second compression logic is utilized to compress response data resulting from the test data inputted into the second part of the integrated circuit. Before compression testing the second part, the first part of the integrated circuit may be placed in a bypass mode. In one implementation, MISR compression, XOR compression, or a combination of MISR and XOR compression are used to compress the response data resulting from the test data inputted into the second part of the integrated circuit.

The invention can take the form of an entirely hardware implementation, an entirely software implementation, or an implementation containing both hardware and software elements. In one aspect, the invention is implemented in software, which includes, but is not limited to, application software, firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include DVD, compact disk-read-only memory (CD-ROM), and compact disk-read/write (CD-R/W).

Figure 9:
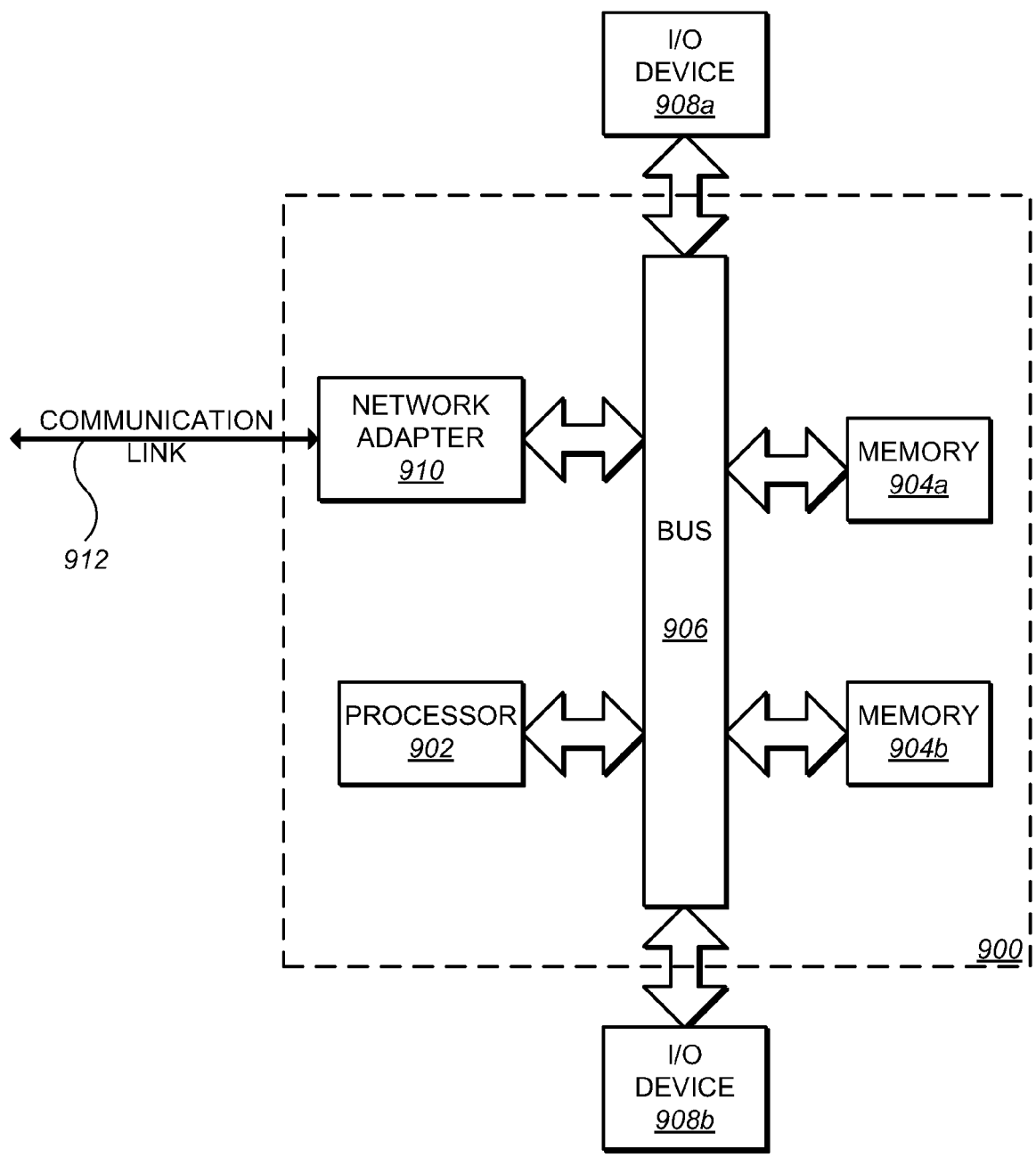
FIG. 9 depicts a block diagram of a data processing system with which implementations of the invention can be implemented.

Shown in FIG. 9 is a data processing system 900 suitable for storing and/or executing program code. Data processing system 900 includes a processor 902 coupled to memory elements 904a-b through a system bus 906. In other implementations, data processing system 900 may include more than one processor and each processor may be coupled directly or indirectly to one or more memory elements through a system bus.

Memory elements 904a-b can include local memory employed during actual execution of the program code, bulk storage, and cache memories that provide temporary storage of at least some program code in order to reduce the number of times the code must be retrieved from bulk storage during execution. As shown, input/output or I/O devices 908a-b (including, but not limited to, keyboards, displays, pointing devices, etc.) are coupled to data processing system 900. I/O devices 908a-b may be coupled to data processing system 900 directly or indirectly through intervening I/O controllers (not shown).

In the implementation, a network adapter 910 is coupled to data processing system 900 to enable data processing system 900 to become coupled to other data processing systems or remote printers or storage devices through communication link 912. Communication link 912 can be a private or public network. Modems, cable modems, and Ethernet cards are just a few of the currently available types of network adapters.

The present invention allows one or more parts of an integrated circuit to be tested. These parts can include the top-level of a chip, individual sub-components of the chip at different hierarchical levels in the design, multiple sub-components tested in parallel, and so forth. By distributing test compression logic across various parts of an integrated circuit, the efficiency of circuit design teams is improved by allowing them to complete sub-components of the integrated circuit independent of other sub-components. In addition, with distributed test compression, sub-components of a chip can be tested independently, which simplifies the testing process while still allowing the entire chip to be tested as a whole.

While various implementations for compression testing of integrated circuits have been described, the technical scope of the present invention is not limited thereto. For example, the present invention is described in terms of particular systems having certain components and particular methods having certain steps in a certain order. One of ordinary skill in the art, however, will readily recognize that the methods described herein can, for instance, include additional steps and/or be in a different order, and that the systems described herein can, for instance, include additional or substitute components. Hence, various modifications or improvements can be added to the above implementations and those modifications or improvements fall within the technical scope of the present invention.

What is claimed is:

1. A method for testing integrated circuits, the method comprising:

providing distinct compression and decompression logic in at least two distinct parts of an integrated circuit; and utilizing the distinct compression and decompression logic to perform compression testing on the at least two distinct parts independently of each other, wherein the at least two distinct parts comprises a first distinct part and includes the distinct compression and decompression logic, wherein the first distinct part comprises a component of the integrated circuit and a second distinct part, wherein the second distinct part comprises a subcomponent of the first distinct part, wherein the distinct compression and decompression logic is coupled to the second distinct part, wherein a hierarchical approach is provided for compression and decompression testing of the component and the subcomponent.

2. The method of claim 1, wherein the first of the at least two distinct parts comprises a plurality of internal scan chains and a plurality of external scan chains, a first signal controls the plurality of internal scan chains of the first distinct part and a second signal controls the plurality of external scan chains of the first distinct part, and the second of the at least two distinct parts comprises a plurality of internal scan chains and a plurality of external scan chains, a third signal controls the plurality of internal scan chains of the second distinct part and a fourth signal controls the plurality of external scan chains of the second distinct part.

3. The method of claim 2, further comprising:

developing a plurality of test modes for the integrated circuit, each of the plurality of test modes being associated with a different on/off combination of the first, second, third, and fourth signals; and selecting one of the plurality of test modes, each of the first, second, third, and fourth signals being in an on or off state in accordance with the on/off combination associated with the one test mode selected.

4. The method of claim 3, further comprising:

applying one or more test patterns to test the integrated circuit;

comparing a response from application of the one or more test patterns to a known good response to determine whether the response matches the known good response;

diagnosing the response to determine which part of the integrated circuit failed when the response does not match the known good response; and selecting another of the plurality of test modes that has not been selected when the response matches the known good response until all of the plurality of test modes have been selected.

5. The method of claim 3, wherein each of the plurality of test modes is used to isolate a portion of the integrated circuit for testing.

6. The method of claim 1, wherein utilizing the distinct compression and decompression logic comprises:

utilizing decompression logic to decompress test data inputted into a corresponding part of the integrated circuit to compression test that part; and utilizing compression logic to compress response data resulting from the test data inputted into that part of the integrated circuit.

7. The method of claim 1, further comprising:

placing one of the at least two distinct parts of the integrated circuit in a bypass mode while another of the at least two distinct parts performs compression testing.

8. The method of claim 1, wherein utilizing the distinct compression and decompression logic comprises:

utilizing the distinct compression and decompression logic in the at least two distinct parts of the integrated circuit to perform compression testing on the first distinct part in parallel with performance of compression testing on the second distinct part.

9. A computer program product for a circuit design process, including a medium storing executable program code, the computer program product comprising code, which when executed, performs the method of claim 1.

10. An integrated circuit comprising:

a first part, the first part comprising a component of the integrated circuit, the first part comprising a first compression logic and a first decompression logic; and a second part distinct from the first part, the second part being a subcomponent of the first part, the second part comprising a second compression logic distinct from the first compression logic and a second decompression logic distinct from the first decompression logic, wherein the first compression logic and the first decompression logic are coupled to the second part, wherein a hierarchical approach is provided for compression and decompression testing of the component and the subcomponent.

11. The integrated circuit of claim 10, wherein the first compression logic and the first decompression logic are utilized to perform compression testing on the first part of the integrated circuit independently of the second part of the integrated circuit.

12. The integrated circuit of claim 11, wherein the first decompression logic is utilized to decompress test data inputted into the first part of the integrated circuit to compression test the first part, and the first compression logic is utilized to compress response data resulting from the test data inputted into the first part of the integrated circuit.

13. The integrated circuit of claim 10, wherein the second compression logic and the second decompression logic are utilized to perform compression testing on the second part of the integrated circuit independently of the first part of the integrated circuit.

14. The integrated circuit of claim 13, wherein the second decompression logic is utilized to decompress test data inputted into the second part of the integrated circuit to compression test the second part, and the second compression logic is utilized to compress response data resulting from the test data inputted into the second part of the integrated circuit.

15. The integrated circuit of claim 10, wherein the first compression logic, the first decompression logic, the second compression logic, and the second decompression logic are utilized to perform compression testing on the first part of the integrated circuit in parallel with performance of compression testing on the second part of the integrated circuit.

16. The integrated circuit of claim 10, wherein the first part comprises a plurality of internal scan chains and a plurality of external scan chains, a first signal controls the plurality of internal scan chains of the first part and a second signal controls the plurality of external scan chains of the first part, and the second part comprises a plurality of internal scan chains and a plurality of external scan chains, a third signal controls the plurality of internal scan chains of the second part and a fourth signal controls the plurality of external scan chains of the second part.

17. The integrated circuit of claim 16, further comprising:

a plurality of test modes, each of the plurality of test modes being associated with a different on/off combination of the first, second, third, and fourth signals.

18. The integrated circuit of claim 17, wherein each of the plurality of test modes is used to isolate a portion of the integrated circuit for testing.

19. The integrated circuit of claim 16, wherein the plurality of internal scan chains of the first and second part comprise a first plurality of state elements coupled with internal logic elements of the first and second part, respectively, and the plurality of external scan chains of the first and second part comprise a second plurality of state elements coupled to inputs or outputs of the first and second part, respectively.

20. The integrated circuit of claim 19, wherein the plurality of internal scan chains of the first and second distinct part comprise a first plurality of state elements coupled with internal logic elements of the first and second distinct part, respectively, and the plurality of external scan chains of the first and second distinct part comprise a second plurality of state elements coupled to inputs or outputs of the first and second distinct part, respectively.

21. The integrated circuit of claim 10, further comprising a third part distinct from the second part, the third part comprising a subcomponent of the second part, the third part comprising a third compression logic distinct from the second compression logic and a third decompression logic distinct from the second compression logic, wherein the second compression logic and the second decompression logic are coupled to the third part comprising the subcomponent of the second part.

\* \* \* \* \*